US007461313B2

(12) United States Patent
Li

(10) Patent No.: US 7,461,313 B2
(45) Date of Patent: Dec. 2, 2008

(54) TEST PATTERN GENERATION

(75) Inventor: Tao Li, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 458 days.

(21) Appl. No.: 10/749,526

(22) Filed: Dec. 30, 2003

(65) Prior Publication Data

US 2005/0144547 A1   Jun. 30, 2005

(51) Int. Cl.
*G01R 31/28* (2006.01)
(52) U.S. Cl. .................................................. 714/738
(58) Field of Classification Search ........................ None
See application file for complete search history.

(56) References Cited

U.S. PATENT DOCUMENTS

| | | | | |
|---|---|---|---|---|
| 5,151,919 A | * | 9/1992 | Dent | 370/209 |
| 5,617,410 A | * | 4/1997 | Matsumoto | 370/342 |
| 5,974,080 A | * | 10/1999 | Papasakellariou | 375/149 |
| 6,061,391 A | * | 5/2000 | Sasaki et al. | 375/222 |
| 6,269,075 B1 | * | 7/2001 | Tran | 370/206 |
| 6,308,065 B1 | * | 10/2001 | Molinari et al. | 455/424 |
| 6,470,000 B1 | * | 10/2002 | Burns et al. | 370/342 |
| 6,611,512 B1 | * | 8/2003 | Burns | 370/342 |
| 6,802,033 B1 | * | 10/2004 | Bertin et al. | 714/704 |
| 7,023,905 B2 | * | 4/2006 | Farine et al. | 375/150 |
| 7,123,590 B2 | * | 10/2006 | Mir et al. | 370/252 |
| 7,151,944 B2 | * | 12/2006 | Hashem et al. | 455/502 |
| 7,203,246 B2 | * | 4/2007 | Ylitalo et al. | 375/267 |
| 2002/0060999 A1 | * | 5/2002 | Ma et al. | 370/335 |
| 2002/0075945 A1 | * | 6/2002 | Farine et al. | 375/148 |
| 2002/0138802 A1 | * | 9/2002 | Firth et al. | 714/733 |
| 2002/0190786 A1 | * | 12/2002 | Yoon et al. | 329/313 |
| 2003/0115533 A1 | * | 6/2003 | Asada et al. | 714/758 |
| 2004/0001426 A1 | * | 1/2004 | Mailaender et al. | 370/203 |
| 2005/0144547 A1 | * | 6/2005 | Li | 714/738 |

FOREIGN PATENT DOCUMENTS

KR         010063686         7/2005

OTHER PUBLICATIONS

Rahul Chauhan, CDMA HUB (http://www.geocities.com/rahulscdmapage/cdma.htm?200620 , Copyright 2002).*
International Search Report-PCT/US04/043230, International Search Authority-US, Jul. 21, 2005.

* cited by examiner

*Primary Examiner*—Jacques Louis-Jacques
*Assistant Examiner*—Steven D Radosevich
(74) *Attorney, Agent, or Firm*—Nicholas J. Pauley; Jonathan T. Velasco; Thomas R. Rouse

(57) ABSTRACT

Apparatus and method for testing a CDMA integrated circuit including a demodulator for correlating input data with one of a set of codes and a test data pattern generator for spreading input test data with one of the set of codes to form a spread test data and providing the spread test data to the demodulator. The set of codes may be combined with the input test data to generate a set of spread test data which are then fed to the various components of the CDMA chip for testing the various components. In one embodiment, each one of the set of codes comprises a scrambling code and a spreading code.

17 Claims, 3 Drawing Sheets

TEST PATTERN GENERATION

BACKGROUND

1. Field

The present disclosure relates generally to generation of test data patterns. More particularly, the disclosure relates to methods and apparatus for generating test data patterns for integrated circuits.

2. Background

Typical modern electronic circuits contain thousands or millions of individual components integrated into a single chip which are too complicated for manual testing. To test these complex electronic circuits, circuit designers are forced to rely on automated testing.

Testing can be achieved by generating test data patterns external to the chip under test and feeding the test pattern signals through the chip's input pins. Use of an external testing generator may require that the chip dedicate some of its pins for testing. This reduces the finite number of pins available for actual chip functions. Additionally, external test pattern generation may be costly, time consuming and logistically more complicated.

Chips designed to support code division multiple access (CDMA) communications are particularly complex. Typically, CDMA chips include additional signal processing functions that may not be required in other applications. To test these CDMA chips with realistic signal stimuli, the test data pattern generator would normally need to generate data patterns with comparable complex signal processing. One prior solution (for eliminating the external test generator) includes an internal test data generator circuit within the CDMA chip itself. However, this increases the complexity of the already complex CDMA chip by increasing the hardware of the CDMA chip. Another prior art solution for reducing the hardware demand of the CDMA chip is to include simplistic internal hardware that generates random test data patterns. However, this does not meet the need for testing the CDMA chip with realistic stimuli.

Accordingly, it would be desirable to generate realistic test data patterns without an external test data pattern generator and without significant increase to the CDMA chip hardware and complexity.

SUMMARY

In one aspect of the present invention, a code division multiple access integrated circuit includes a demodulator configured to correlate input data with a plurality of codes, and a test data pattern generator configured to spread an input test data with one of the plurality of codes to form a spread test data and provide the spread test data to the demodulator.

In another aspect of the invention, a code division multiple access integrated circuit includes means to correlate an input data with a plurality of codes and means to spread an input test data with one of the plurality of codes to form a spread test data and to provide the spread test data as the input data.

In another aspect of the invention, a method of testing a code division multiple access integrated circuit, including the steps of correlating an input data with a plurality of codes within a demodulator, spreading an input test data with one of the plurality of codes to form a spread test data, and providing the spread test data to the demodulator.

It is understood that other embodiments of the present invention will become readily apparent to those skilled in the art from the following detailed description, wherein it is shown and described various embodiments of the invention by way of illustration. As will be realized, the invention is capable of other and different embodiments and its several details are capable of modification in various other respects, all without departing from the spirit and scope of the present invention. Accordingly, the drawings and detailed description are to be regarded as illustrative in nature and not as restrictive.

BRIEF DESCRIPTION OF THE DRAWINGS

Aspects of the present invention are illustrated by way of example, and not by way of limitation, in the accompanying drawings, wherein.

DETAILED DESCRIPTION

The detailed description set forth below in connection with the appended drawings is intended as a description of various embodiments of the present invention and is not intended to represent the only embodiments in which the present invention may be practiced. Each embodiment described in this disclosure is provided merely as an example or illustration of the present invention, and should not necessarily be construed as preferred or advantageous over other embodiments. The detailed description includes specific details for the purpose of providing a thorough understanding of the present invention. However, it will be apparent to those skilled in the art that the present invention may be practiced without these specific details. In some instances, well-known structures and devices are shown in block diagram form in order to avoid obscuring the concepts of the present invention. Acronyms and other descriptive terminology may be used merely for convenience and clarity and are not intended to limit the scope of the invention.

In the following description, various systems and techniques will be described in the context of a CDMA communications device. While these techniques may be well suited for use in this type of application, those skilled in the art will readily appreciate that these systems and techniques may be applied to any communications device. Accordingly, any reference to a CDMA communications device is intended only to illustrate various inventive aspects of the present invention, with the understanding that these inventive aspects have a wide range of applications.

Figure 1:
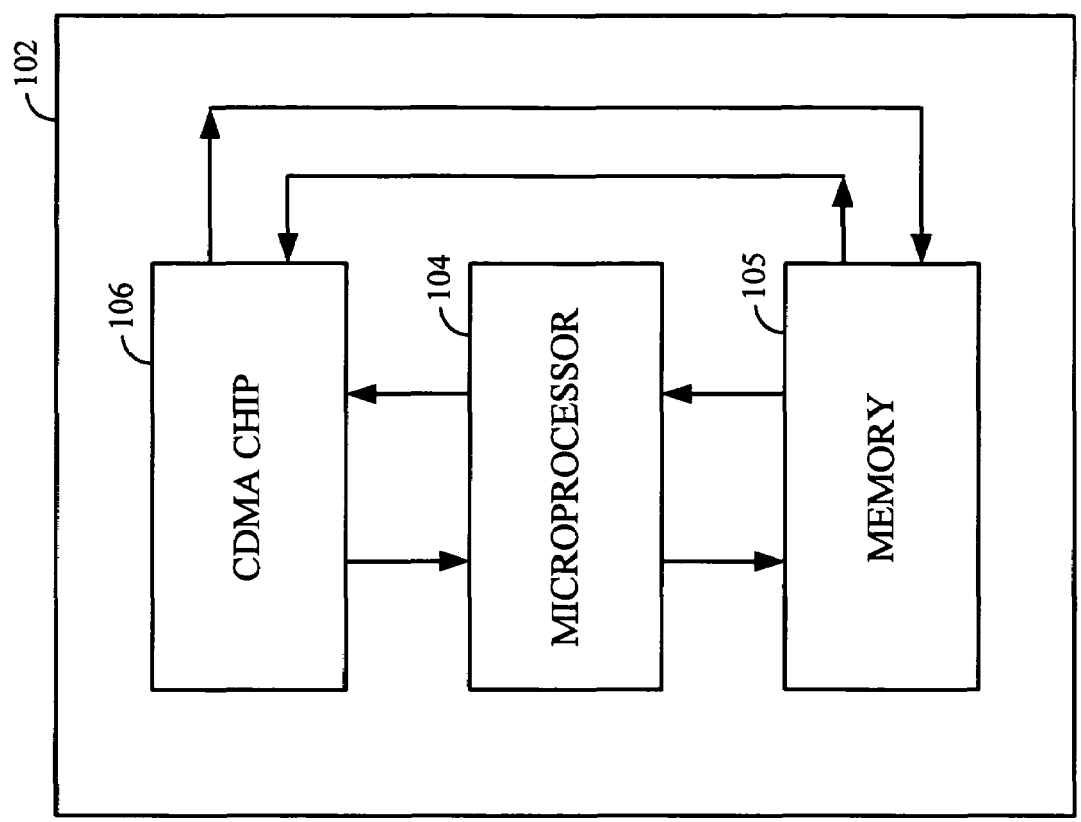
FIG. 1 is a conceptual block diagram illustrating an example of a wireless communications device.

FIG. 1 is a conceptual block diagram illustrating one possible configuration of a wireless communications device 102 for CDMA applications. As those skilled in the art will appreciate, the precise configuration of the wireless communications device 102 may vary depending on the specific application and the overall design constraints. The wireless communications device 102 may be implemented with a software based processor, or any other configuration. In the embodiment shown in FIG. 1, the software based processor may have a microprocessor 104 with memory 105. The microprocessor 104 may provide a platform to run software programs that, among other things, handles all of the housekeeping functions for the various user interfaces (not shown) and coordinates the command and control signaling functions with the base station (not shown). The base station may be used to support communications between multiple wireless devices, or alternatively, be used to connect a wireless device to a network, such as a circuit-switched or packet-switched network.

The wireless communications device 102 may include a CDMA integrated circuit or chip 106 that executes specific algorithms to reduce the processing demands on the microprocessor 104. The CDMA chip 106 may be a digital signal processor (DSP), an application specific integrated circuit (ASIC), a field programmable gate array (FPGA) or other programmable logic device, discrete gates, transistor logic, discrete hardware components, or any other equivalent or nonequivalent structures that can perform one or more of the functions described herein. The specific algorithms executed by the CDMA chip 106 may include encoding and modulation functions, as well as other various spread spectrum operations for CDMA communications. In a manner to be described in greater detail later, the CDMA chip 106 may also include a testing function to ensure proper operation of the hardware at the factory.

When the wireless communications device 102 powers up, it may attempt to establish communications with a base station (not shown) using an access procedure. The access procedure may involve the acquisition of a pilot signal transmitted from one or more base stations. The pilot signal transmitted from each base station may be scrambled with a different base station specific scrambling code. The acquisition of each pilot signal includes well known procedures for determining the scrambling codes for each of the respective base station. These scrambling codes may be stored in the memory 105 for later use by the CDMA chip 106.

Once the wireless device 102 acquires the pilot signals, it may communicate with each of the base stations using various control and traffic channels. The control and traffic channels may be discriminated by spreading each channel with an orthogonal code, such as Walsh codes. In some applications, variable length Walsh codes may be used to support higher data rates. Variable length Walsh codes are often referred to in the art as Orthogonal Variable Spreading Factor (OVSF) codes. The Walsh code for each control channel may be fixed, and therefore, may be preprogrammed into the microprocessor or the CDMA chip at the factory. These Walsh codes may be used by the wireless communications device 102 to access the control channels, which may be used by the base station to assign the OVSF codes to support the various traffic channels. The assigned OVSF codes may also be stored in memory 105 for later use by the CDMA chip 106.

Figure 2:
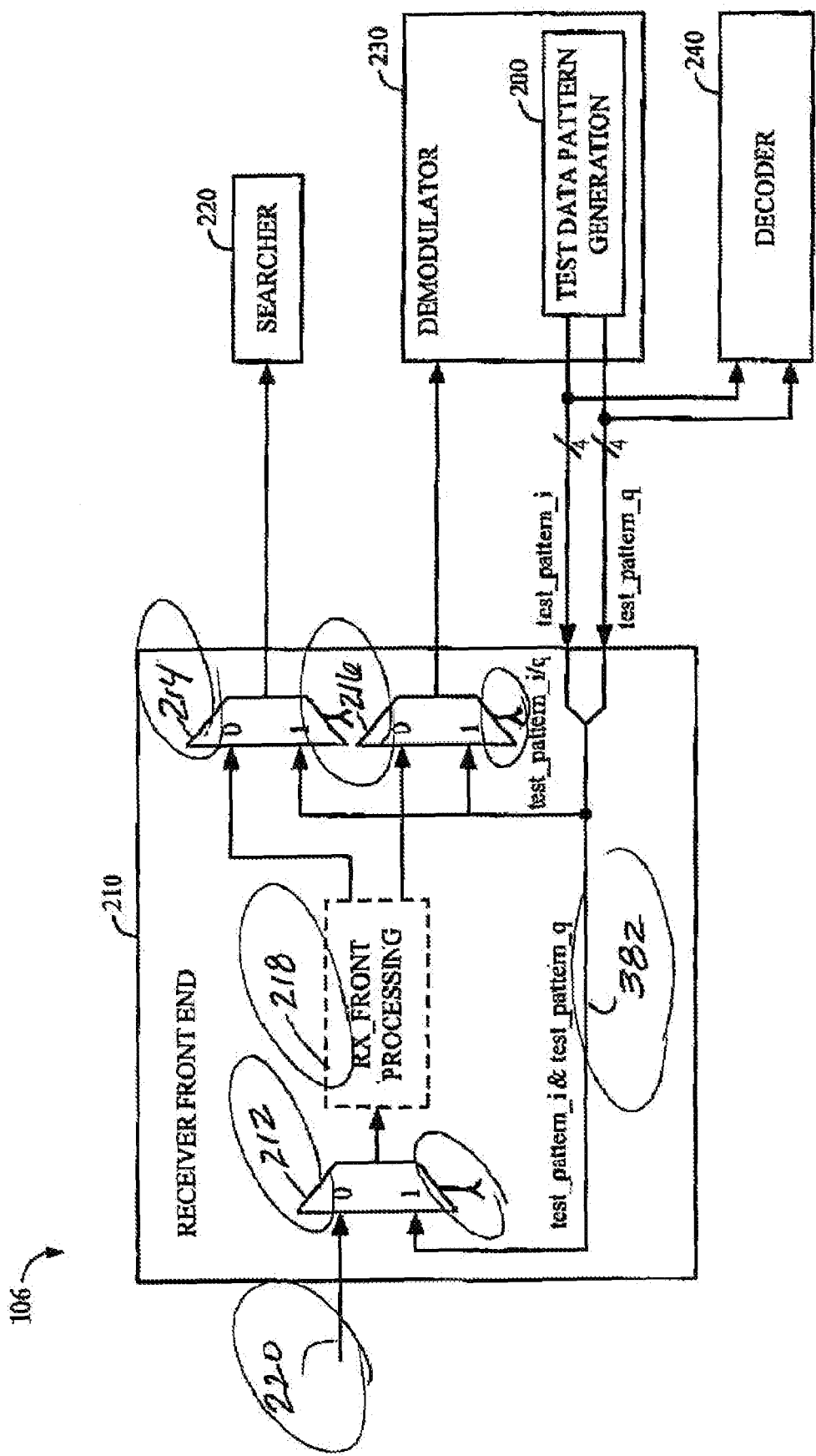
FIG. 2 is a conceptual block diagram illustrating an example of a CDMA chip for use in a wireless communications device.

FIG. 2 is a conceptual block diagram illustrating an example of a CDMA chip. The CDMA chip 106 includes a receiver front end 210, a searcher 220, a demodulator 230, and a decoder 240. The receiver front end 210 further includes multiplexers 212, 214, and 216. and receiver front end processing (e.g., RX FRONT PROCESSING) 218. The receiver front end 210 accepts a digitized received signal 220 from an antenna (not shown) through an analog front end (not shown), and performs baseband filtering of the received digitized signal 220. Each of the multiplexers 212, 214, and 216 receives a corresponding selection signal that causes each multiplexer to selectively switch between passing the digitized received signal 220, at logic "0," or the test data pattern 382, at logic "1," (shown in FIG. 3 as test pattern i/q). The demodulator 230 performs initial CDMA signal processing on the filtered digitized signal such as, but not limited to, descrambling the signal with the various scrambling codes to identify the base station source of the transmission, and □ ispreading the signal with the various OVSF codes to separate the traffic and control channels for each base station. Next, the decoder 240 may be used to provide additional signal processing functions such as, but not limited to, deinterleaving and decoding.

The demodulator 230 may be implemented in a variety of fashions. By way of example, a rake receiver (not shown) may be used to combat fading through diversity techniques. A rake receiver typically utilizes independent fading of resolvable multipath signals to achieve diversity gain. This may be achieved through a combined effort between the searcher 220 and the rake receiver. More specifically, the searcher 220 may be configured to identify strong multipath arrivals for each pilot signal using the appropriate scrambling codes. Fingers can then be assigned by the searcher 220 to identify the timing offsets of the multipath signals. The fingers can be used by the rake receiver as a timing reference to correlate the traffic for each anticipated multipath reflection for an OVSF channel. The separate correlations for each OVSF channel can then be coherently combined and provided to the decoder 240 for deinterleaving and decoding.

A test data pattern generator circuit 200 resident on the CDMA chip 106 may be used for testing purposes. In one embodiment, a test data pattern generation circuit 200 is shown inside the demodulator 230. The test data pattern generation circuit 200 generates test data patterns for testing the various CDMA chip components such as, but not limited to, the receiver front end 210, the searcher 220, the demodulator 230, the decoder 240 or any combination thereof. In other embodiments, the test data pattern generation circuit 200 can be located as a separate component within the CDMA chip 106 or within one of the other CDMA chip components. A test microprocessor and memory (not shown) may be used in place of the microprocessor 104 and memory 105 of FIG. 1 to assign the various scrambling codes and the OVSF codes to operate the rake receiver.

Figure 3:
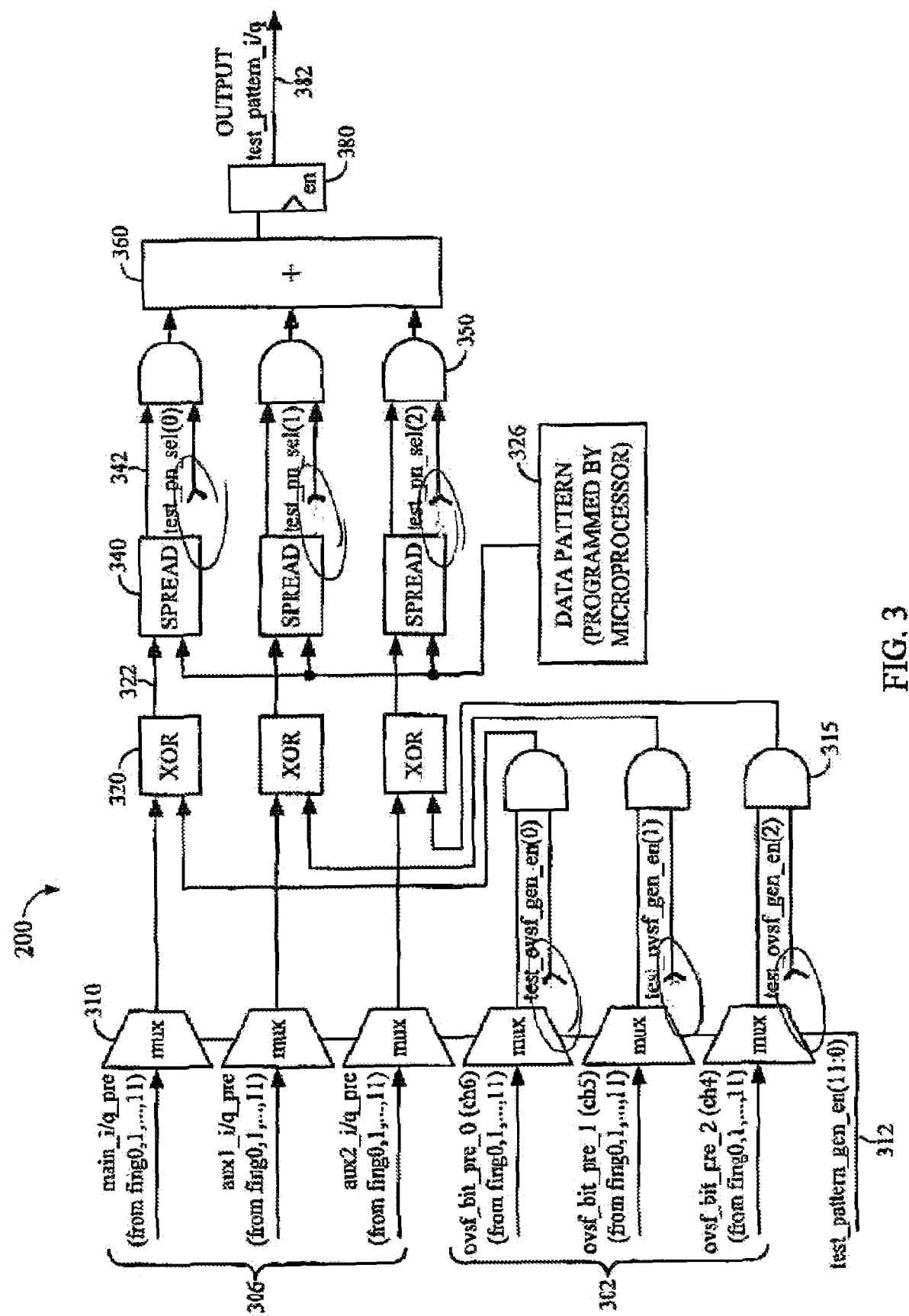
FIG. 3 is a functional block diagram illustrating an example of a test data pattern generation circuit.

FIG. 3 is a block diagram of the test data pattern generation circuit 200. The test data pattern generation circuit 200 includes multiplexers 310, combiners 320, spreaders 340, an adder 360 and a delay element 380. In one embodiment, the combiners 320 are logical XOR circuits. Inputs to a multiplexer 310 include multiple OVSF codes 302 and multiple scrambling codes 306 generated by the test microprocessor and memory. This architecture allows for the efficient reuse of existing hardware circuitry within the CDMA chip 106 without replicating similar hardware within test data pattern generation circuit 200.

The OVSF codes 302 and the scrambling codes 306 are inputs to a logical XOR circuit 320. The spreading code 322 (which is a logical combination of the OVSF codes 302 and the scrambling codes 306) is then fed as one of two inputs to a spreader 340. The second input to the spreader 340 is an input test data pattern 326, which may also be generated by the test microprocessor and memory. The characteristic of input test data pattern 326 is selected based on the desired testing profile and will be known to one skilled in the art. The spread test data pattern 342 is the spread spectrum form of the input test data pattern 326 using techniques of spectrum spreading known to one skilled in the art. An output spread test data pattern 382 (which corresponds to the spread test data pattern 342) is then used to test the various components of the CDMA chip 106, such as, but not limited to, the receiver front end 210, the searcher 220, the demodulator 230, the decoder 240 or any combination thereof. If there are a plurality of spread test data patterns 342, the output spread test data pattern 382 is a superposition of the plurality of spread test data patterns 342. If there is only one spread test data pattern 342, the output spread test data pattern 382 is the same as the spread test data pattern 342.

In one embodiment, the spreading code 322 is disabled and the spreader 340 is replaced by an interleaver (not shown) configured to interleave the input test data pattern 326 into an interleaved test data pattern for testing the decoder 240 of the CDMA chip 106. Here, the decoding function of the decoder 240 is bypassed in the testing configuration. In another embodiment, the spreading code 322 is disabled and the spreader 340 is replaced by an encoder (not shown) configured to encode the input test data pattern 326 into an encoded test data pattern for testing the decoder 240 of the CDMA chip 106. Here, the interleaving function of the decoder 240 is bypassed in the testing configuration. In yet another embodiment, the spreader 340 is replaced by an interleaver and an encoder configured to interleave and encode the input test data pattern 326 into an encoded, interleaved test data pattern for testing the decoder 240 of the CDMA chip 106.

In one embodiment, the OVSF codes 302 and scrambling codes 306 from multiple fingers are input separately to two multiplexers 310. In one embodiment, the input to one multiplexer 310 includes twelve OVSF codes 302, and the input to another multiplexer 310 includes twelve scrambling codes 306. An enable signal 312 generated by the test microprocessor sequentially enables each of the multiple sets of OVSF codes 302 and scrambling codes 306 to sequentially generate output XOR signals 322. This sequential approach allows using only one spreader 340 in test data pattern generation circuit 200 to synthesize spread test data patterns 342.

In one embodiment, additional parallel paths of multiple OVSF codes 302 and multiple scrambling codes 306 are input separately to parallel sets of two multiplexers 310. In one embodiment, as shown in FIG. 3, three parallel paths of multiple OVSF codes 302 and multiple scrambling codes 306 are input separately to three parallel sets of two multiplexers 310. In this embodiment, there are six multiplexers 310, three logical XOR circuits 320 and three spreaders 340. An adder 360 adds the parallel paths as a single output spread test data pattern 382.

In one embodiment, logical AND gates 315 are implemented to gate off the paths of the OVSF codes 302 if desired. In another embodiment, logical AND gates 350 are implemented to gate off the path of any spread test data pattern 342 if desired. The logical AND gates 315, 350 are enabled by enable signals from the test microprocessor. Additionally, in one embodiment, a delay element 380 is implemented to match time delays associated with the CDMA chip 106.

The various illustrative logical blocks, modules, and circuits described in connection with the embodiments disclosed herein may be implemented or performed with a general purpose processor, a DSP, an ASIC, a FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. A storage medium may be coupled to the processor such that the processor can read information from, and write information to, the storage medium. In the alternative, the storage medium may be integral to the processor. The processor and the storage medium may reside in an ASIC. The ASIC may reside in the wireless communications device, or elsewhere. In the alternative, the processor and the storage medium may reside as discrete components in the wireless communications device, or elsewhere.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A wireless communications device integrated circuit, comprising:
    a demodulator configured to correlate an input data with a plurality of codes;
    a test data pattern generator configured to spread an input test data with at least one of the plurality of codes to form a spread test data, and to provide the spread test data to the demodulator, and
    a multiplexer configured to multiplex the input data and the spread test data to the demodulator;
    wherein at least one of the plurality of codes comprises a scrambling code and a spreading code.

2. The integrated circuit of claim 1 wherein the scrambling code comprises a pseudo-random noise (PN) code and the spreading code comprises a Walsh code.

3. The integrated circuit of claim 1 wherein the test pattern generator further comprises a plurality of AND gates configured to gate off the scrambling code.

4. The integrated circuit of claim 1 wherein the test pattern generator further comprises a plurality of AND gates configured to gate off the spreading code.

5. The integrated circuit of claim 1 wherein the test data pattern generator further comprises a combiner configured to combine a plurality of scrambling codes and a plurality of spreading codes to form the plurality of codes.

6. The integrated circuit of claim 5 wherein the combiner comprises a logical XOR circuit.

7. The integrated circuit of claim 1 wherein the test data pattern generator further comprises a plurality of spreaders configured to spread the input test data with the plurality of codes to form a plurality of spread test data.

8. The integrated circuit of claim 7 wherein the test data pattern generator further comprises a plurality of AND gates configured to gate off at least one spread test data.

9. A wireless communications device integrated circuit, comprising:
    a demodulator configured to correlate an input data with a plurality of codes;
    a test data pattern generator configured to spread an input test data with at least one of the plurality of codes to form a spread test data, and to provide the spread test data to the demodulator;
    a combiner configured to combine a plurality of scrambling codes and a plurality of spreading codes to form the plurality of codes; and
    a multiplexer configured to select the scrambling code from a plurality of scrambling codes, select the spreading code from a plurality of spreading codes, and provide the scrambling code and spreading code to the combiner.

10. The integrated circuit of claim 9 wherein the demodulator further comprises a rake receiver having a plurality of fingers, one of the fingers being configured to receive the scrambling code and the spreading code.

11. A wireless communications device integrated circuit, comprising:
   means for correlating an input data with a plurality of codes;
   means for spreading an input test data with at least one of the plurality of codes to form a spread test data, and means for providing the spread test data as the input data; and
   means for multiplexing the input data and the spread test data;
   wherein at least one of the plurality of codes comprises a scrambling code and a spreading code.

12. The integrated circuit of claim 11 wherein the scrambling code comprises a pseudo-random noise (PN) code and the spreading code comprises a Walsh code.

13. The integrated circuit of claim 11 further comprising means for gating off the scrambling code and means for gating off the spreading code.

14. The integrated circuit of claim 11 further comprising means for combining a plurality of scrambling codes and a plurality of spreading codes to form the plurality of codes.

15. A wireless communications device integrated circuit, comprising:
   means to correlating an input data with a plurality of codes;
   means to spreading an input test data with at least one of the plurality of codes to form a spread test data, and means for providing the spread test data as the input data;
   means for combining a plurality of scrambling codes and a plurality of spreading codes to form the plurality of codes; and
   means for selecting the scrambling code from a plurality of scrambling codes and means for selecting the spreading code from a plurality of spreading codes.

16. A method of testing a wireless communications device integrated circuit, comprising the steps of:
   correlating an input data with a plurality of codes within a demodulator;
   spreading an input test data with at least one of the plurality of codes to form a spread test data, and providing the spread test data to the demodulator; and
   multiplexing the input data and the spread test data;
   wherein at least one of the plurality of codes comprises a scrambling code and a spreading code.

17. The method of claim 16 further comprising the step of combining a plurality of scrambling codes and a plurality of spreading codes to form the plurality of codes.

* * * * *